United States Patent [19]

George et al.

[11] Patent Number: 5,136,251
[45] Date of Patent: Aug. 4, 1992

[54] CAPACITANCE MEASUREMENT

[75] Inventors: Richard E. George; Glade B. Bacon; Richard D. Beckert, all of Everett, Wash.

[73] Assignee: John Fluke Mfg. Co., Inc., Everett, Wash.

[21] Appl. No.: 648,277

[22] Filed: Jan. 31, 1991

Related U.S. Application Data

[63] Continuation-in-part of Ser. No. 248,489, Sep. 23, 1988, Pat. No. 5,073,757.

[51] Int. Cl.[5] ........................................... G01R 27/26
[52] U.S. Cl. ..................................... 324/678; 324/607; 324/677; 341/150
[58] Field of Search ................ 341/150, 172; 324/678, 324/607, 677, 676

[56]   References Cited
U.S. PATENT DOCUMENTS

| | | | |
|---|---|---|---|
| 4,039,940 | 9/1977 | Butler | 324/678 |
| 4,040,041 | 8/1977 | Fletcher et al. | |
| 4,187,460 | 2/1980 | Dauge | 324/678 |
| 4,217,543 | 9/1980 | Strong | 324/678 |
| 4,556,867 | 12/1985 | George | |
| 4,775,830 | 10/1988 | Lyyra | 324/678 |
| 4,797,603 | 1/1989 | Choisnet | 324/678 |
| 5,028,876 | 7/1991 | Cadwell | 324/678 |
| 5,073,757 | 12/1991 | George | 324/677 |

Primary Examiner—Kenneth A. Wieder
Assistant Examiner—Jose M. Solis
Attorney, Agent, or Firm—John P. Dellett

[57]   ABSTRACT

The capacitance of an unknown capacitor is measured with multimeter instrumentation employing a dual slope analog-to-digital converter. The initial voltage across the capacitor is measured and the capacitor is cyclically charged until the capacitor reaches a predetermined proportion of possible charge. The final voltage is measured. The voltage across the charging resistance is integrated over successive charging cycles to provide a value proportional to the charge delivered to the capacitor and this value is divided by the difference between the initial and final voltages.

23 Claims, 10 Drawing Sheets

CAPACITANCE MEASUREMENT

BACKGROUND OF THE INVENTION

This application is a continuation-in-part of the application of Richard E. George entitled APPARATUS FOR AND METHOD OF MEASURING CAPACITANCE, Ser. No. 07/248,489 filed Sep. 23, 1988 issued Dec. 17, 1991 as U.S. Pat. No. 5,073,757.

The present invention relates to measurement of capacitance and particularly to accurate capacitance measurement up to relatively high values in the environment of a conventional multimeter.

Accurate measurement of capacitance is usually performed employing specialized instruments such as a capacitance bridge. This instrumentation is apt to be expensive and require special procedures on the part of the operator. In the co-pending application of Richard E. George, referenced above, a method and apparatus is disclosed for measuring capacitance in a multimeter environment. An unknown capacitor is discharged and then substantially completely charged through a reference resistor while at the same time a proportional charge is accumulated in the storage capacitor of a dual slope analog-to-digital converter. The charge is removed from the storage capacitor over a variable time interval for indicating the unknown value of capacitance.

The foregoing method is very effective for measurement of smaller capacitance values, e.g. below five microfarads, but has less applicability to high capacitance measurements because of limitations in the cycle time of the analog-to-digital converter. Moreover, the unknown capacitor is assumed to be discharged initially to zero volts after which the capacitor is charged to greater than ninety-nine percent of the reference voltage value in the measurement cycle, resulting in delays in reading out larger capacitance values.

SUMMARY OF THE INVENTION

In accordance with the present invention, an unknown capacitor is discharged to a predetermined minimum threshold value and the initial voltage across the capacitor is measured. Then the capacitor is charged through a reference resistor over a sequence of cycles during each of which a charging current is supplied to the capacitor until the voltage across the reference resistor, as measured by a dual slope analog-to-digital converter, drops below a value indicating a predetermined proportion of possible charge has been delivered. The voltage drop across the reference resistor is "integrated" by adding the cycle counts generated during deintegration periods of the converter for providing a value proportional to the actual charge delivered to the unknown capacitor. The final voltage across the unknown capacitor is measured and the voltage as measured initially thereacross is subtracted therefrom to provide a delta V value. The count sum is divided by delta V to produce a result proportional to the unknown capacitance.

It is therefore an object of the present invention to provide an improved and inexpensive method and apparatus for measuring capacitance.

It is another object of the present invention to provide an improved method and apparatus for making accurate capacitance measurements in a conventional multimeter setting.

It is a further object of the present invention to provide an improved method and apparatus for measuring relatively high capacitance values.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is an overall block diagram of a multimeter in accordance with the present invention, FIG. 2 is a simplified schematic diagram of a dual slope, integrating, analog-to-digital converter utilized according to the present invention, FIG. 3 depicts a waveform generated according to the FIG. 2 circuit when a constant voltage level is applied between terminal 34 and terminal LO, FIG. 4 is a schematic and block diagram particularly illustrating switching circuitry used in measuring an unknown capacitance according to the present invention, FIG. 5 is a waveform chart illustrating a $V_{CINT}$ waveform of the analog-to-digital converter when an unknown capacitor is being charged, FIG. 6 is a waveform chart illustrating overall capacitance measurement according to the present invention, FIGS. 7-11 are flow charts of software employed in operating circuitry according to the present invention, and FIG. 12 is a simplified schematic diagram of a charging circuit according to the present invention.

DETAILED DESCRIPTION

Figure 1:
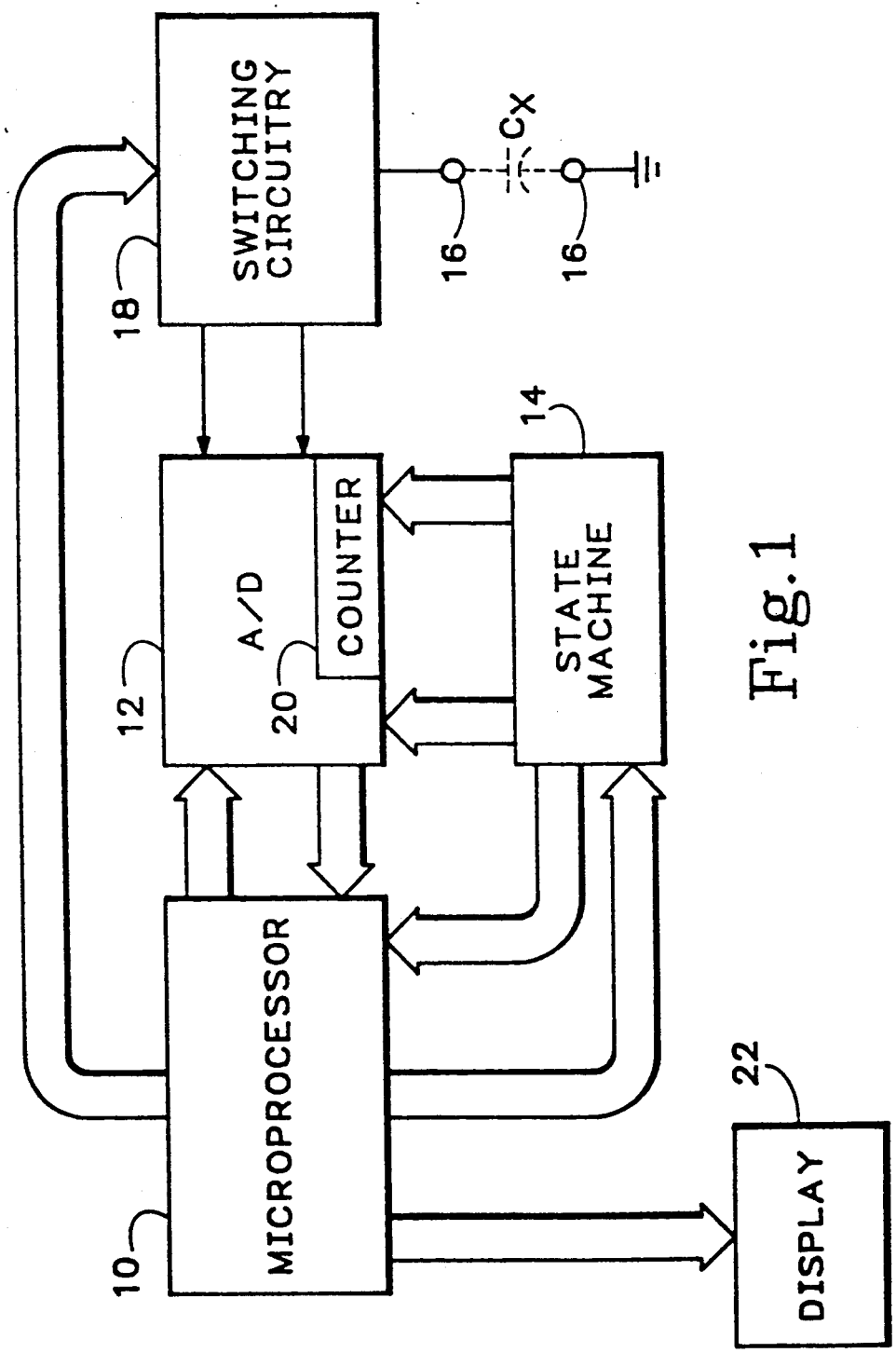

Referring to the drawings and particularly to FIG. 1, comprising a block diagram of an overall instrument according to the present invention, a microprocessor 10 controls a dual slope, integrating, analog-to-digital converter 12 in a known manner via state machine 14 for measuring an unknown value between terminals 16. One of the terminals 16 is grounded and the remaining terminal is coupled to the input of the analog-to-digital converter by way of switching circuitry 18 configurable by the microprocessor. The analog-to-digital converter 12 includes a counter 20 providing a numerical read out convertible via microprocessor 10 to display 22. In typical use of the meter illustrated in FIG. 1, terminals 16 are connected to an unknown voltage. Within the A to D converter 12 a capacitor is charged with a current proportional to the unknown voltage for a predetermined time period. The capacitor is then discharged employing a constant reference current and the time for discharge is measured by means of counter 20 to provide an accurate representation of the unknown voltage. Converter 12 is suitably a dual rate, dual slope, integrating analog-to-digital converter as disclosed in U.S. Pat. No. 4,556,867 to Richard E. George.

Figure 2:
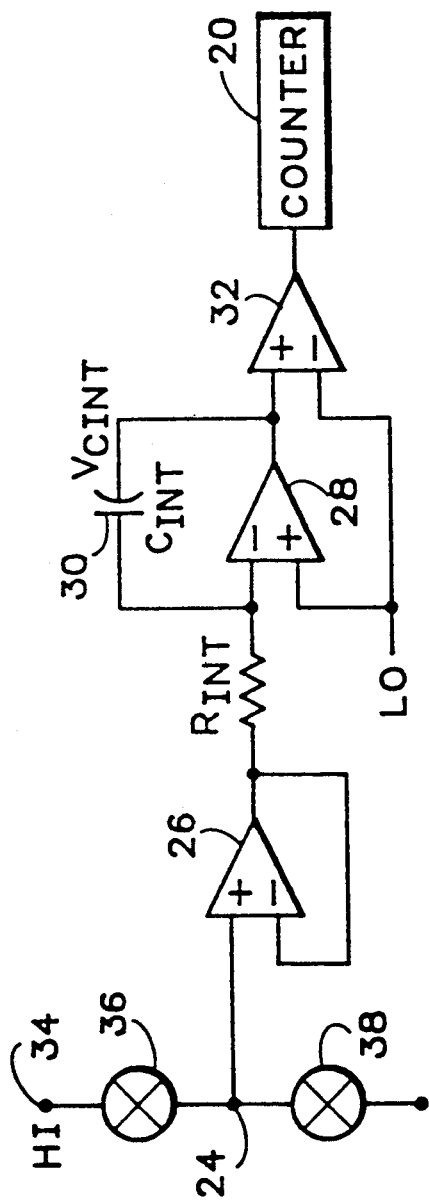

FIG. 2 is a simplified diagram of the converter including a HI input terminal 34 connectable through switch 36 to the noninverting input of voltage follower amplifier 26. A voltage applied at terminal 24 and delivered through amplifier 26 to reference resistor $R_{INT}$ produces a proportional current at the inverting input of integrating amplifier 28, the latter having an integrating or storage capacitor 30 shunted between its output and inverting input. The output of integrating amplifier 28 is connected to one input terminal of comparator 32 while the remaining input terminal as well as the noninverting input terminal of amplifier 28 are returned to the converter LO input which may be grounded. The output of comparator 32 is coupled to counter 20 for the purpose of stopping a count thereof to provide the digital output of the converter.

Figure 3:
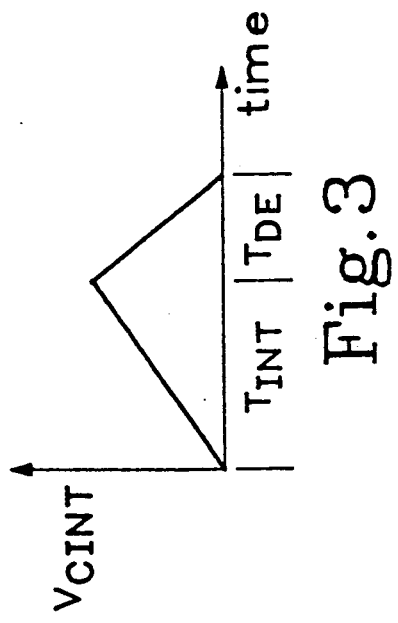

The converter of FIG. 2 is controlled in a conventional manner by state machine 14 in FIG. 1 for alternating between "integrate" and "deintegrate" phases. For example, in measuring an unknown voltage $V_{IN}$ applied at terminal 34 via switch 36 to terminal 24 of the converter with respect to LO or ground, a current is caused to flow through resistor $R_{INT}$ in proportion to the unknown voltage. The current is effective for charging capacitor 30 during a first predetermined time period designated $T_{INT}$. In a particular circuit according to the present invention, the time $T_{INT}$ was equal to 5.5008 milliseconds. At the end of the fixed time period, switch 36 is opened and a switch 38 is closed for delivering a known voltage $V_{DE}$ to terminal 24 of the circuit with respect to LO or ground, $V_{DE}$ having the opposite polarity from the unknown voltage. The capacitor 30 discharges linearly during time $T_{DE}$ as illustrated in FIG. 3 until comparator 32 detects return to the initial LO value. Counter 20 is caused to initiate a timing cycle at the beginning of the time period $T_{DE}$ and when the output of comparator 32 indicates discharge, counter 20 stops counting providing a value to microprocessor 10 which is accurately proportional to the unknown voltage. The equation as applicable to the operation of the A to D converter is given as follows:

$$(V_{IN}T_{INT})/R_{INT} = (V_{DE}T_{DE})/R_{INT}.$$

Solving for $V_{IN}$, $$V_{IN} = K(T_{DE}).$$

where K is a circuit constant.

Thus, for a fixed period of time, $T_{INT}$, a current proportional to $V_{IN}$ is provided to the integrating amplifier whereby capacitor 30 is charged to a value proportional to the unknown voltage $V_{IN}$. Then, the capacitor 30 is discharged in a linear manner for a time period which is proportional to the unknown voltage.

Figure 4:
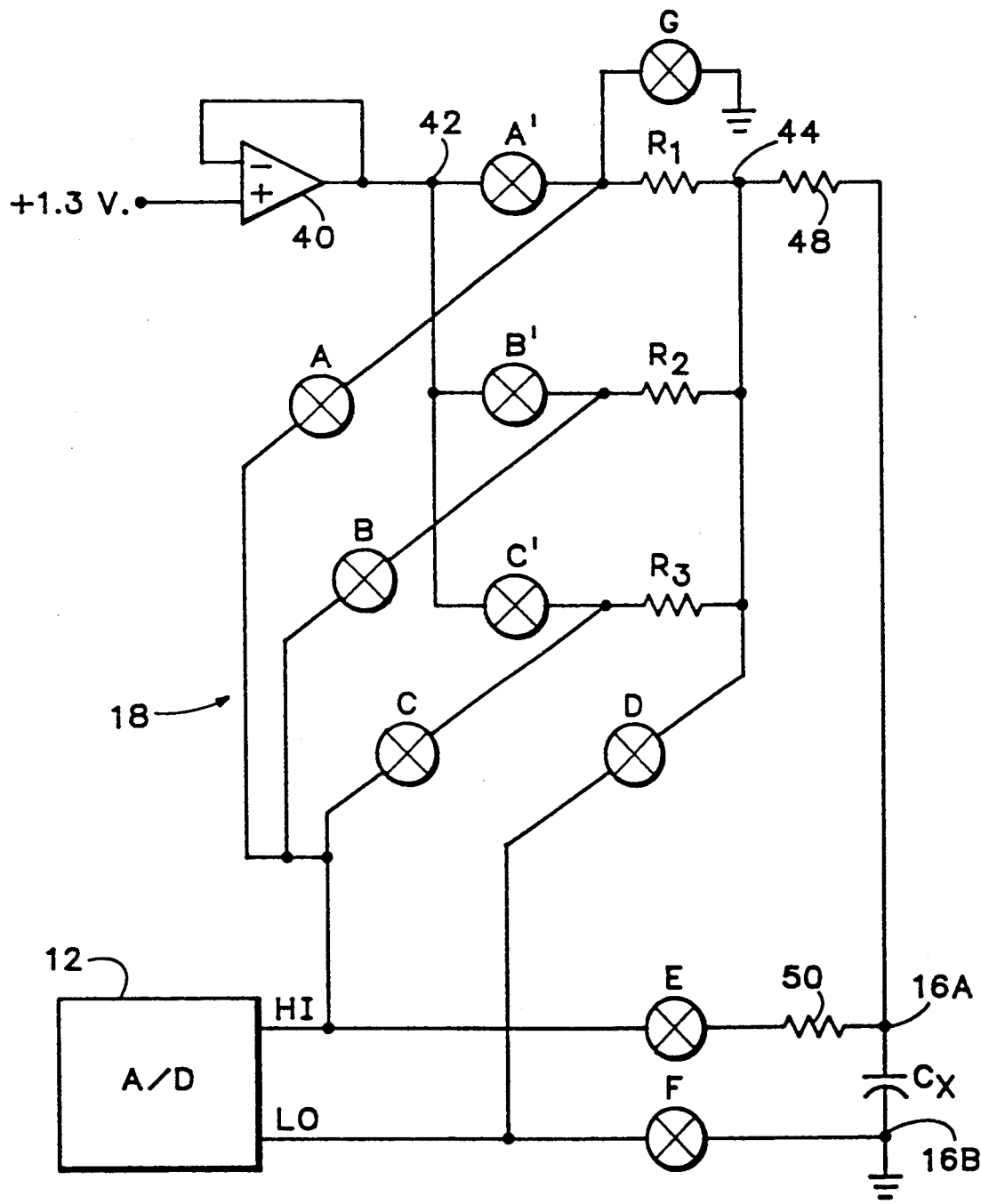

Referring to FIG. 4, illustrating circuitry according to the present invention used in measuring an unknown capacitance, and particularly to switching circuitry 18 as configured for measuring the unknown capacitor $C_X$, a unity gain amplifier 40 is provided at its noninverting input with a constant voltage value (here 1.3 volts) for application at node 42 also selectively connected via switches A', B' and C' to respective reference resistors $R_1$, $R_2$ and $R_3$ and via the resistors to a second node 44. The interconnections between switches A', B' and C' and resistors $R_1$, $R_2$ and $R_3$ are coupled by way of respective switches A, B and C to the HI input of dual slope, integrating, analog-to-digital converter 12. A switch G is interposed between the switch A', resistor $R_1$ interconnection and ground. Node 44 is also coupled by means of switch D to the LO input of the dual slope, integrating, analog-to-digital converter 12 and through overvoltage protection resistor 48 to test input terminal 16A. A series circuit including switch E and resistor 50, having a large resistance value, is interposed between test input terminal 16A and the HI input of converter 12 while a switch F is located between test input terminal 16B and the LO input of the converter. Terminal 16B is ordinarily returned to ground.

The lettered switches in FIGS. 4, A, B, C, D, E, F, G, A', B' and C', are controlled by microprocessor 10 in FIG. 1 in accordance with a predetermined sequence for measuring the value of unknown capacitor $C_X$ disposed between terminals 16A and 16B. The phases of this procedure are set forth as follows:

TABLE I

| Phase | Switches Closed |
| --- | --- |
| Discharge | G, E, F |
| Initial Voltage | E, F |
| Charge | A, D, A' |
| Final Voltage | E, F |

Figure 6:
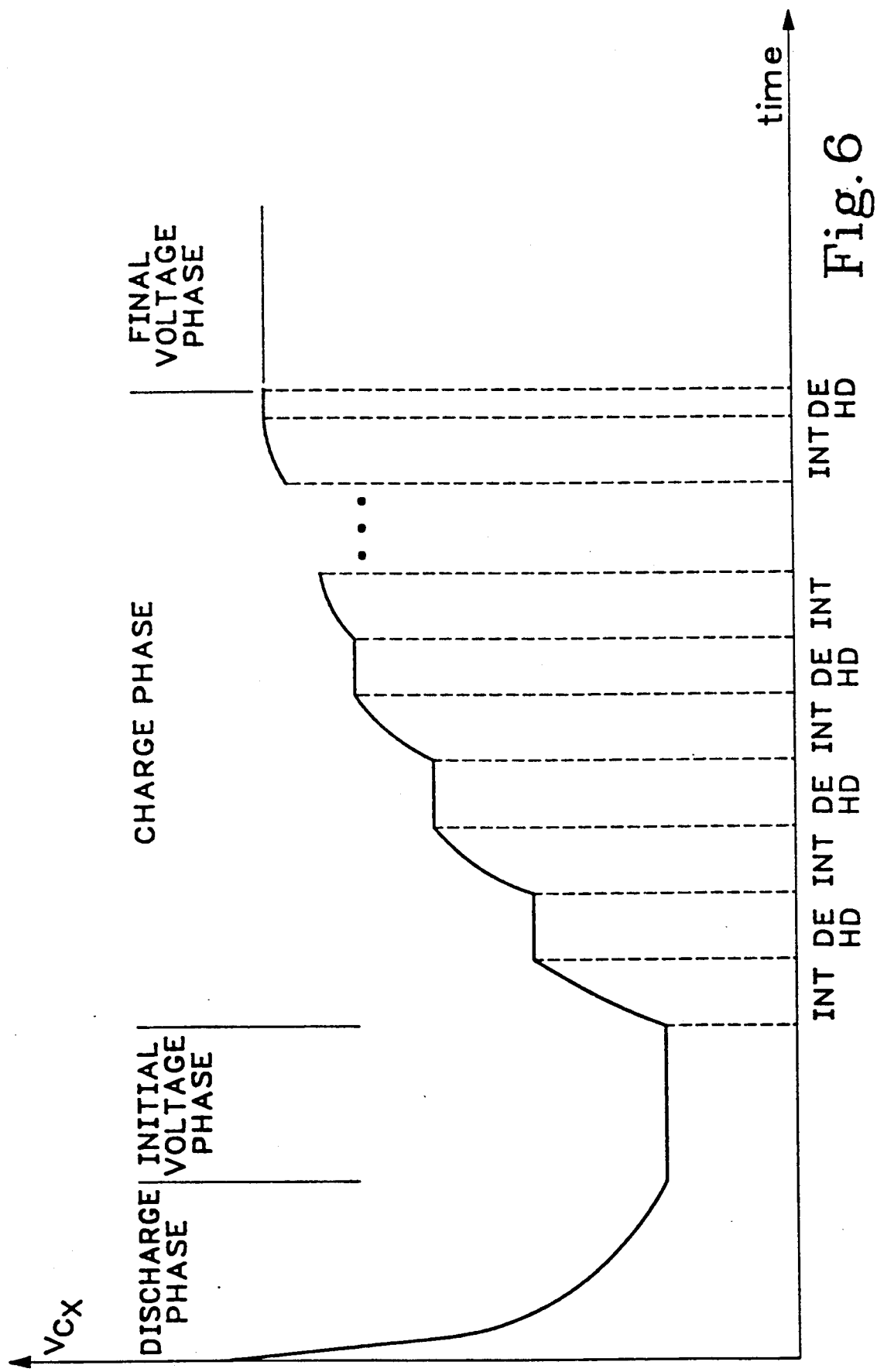

The respective phases are also illustrated by the waveform chart of FIG. 6. During a first phase, the capacitor $C_X$, whose value is to be measured, is discharged. Theoretically, the capacitor could be discharged to zero volts by closing switch G to ground. However, it is not assumed that the entire charge is removed from capacitor $C_X$ inasmuch as in most instances this will not take place. In any case, the voltage across the capacitor is measured during the discharge phase until the voltage across the capacitor falls below a predetermined minimum threshold as may be conveniently designated according to the count output of converter 12. That is, the voltage is determined by the count of counter 20. The analog-to-digital converter 12 repeatedly measures the voltage across the capacitor $C_X$ during a number of successive cycles called "minor cycles" during which a procedure similar to that depicted in FIG. 3 repeatedly occurs, i.e., wherein capacitor 30 in FIG. 2 is charged and discharged, until the count for the deintegration time ($T_{DE}$) for the last cycle falls below a given value. The discharge phase is illustrated at the left in the FIG. 6 waveform.

Following the initial discharge period, the initial voltage is remeasured over several minor cycles (for improved accuracy) and is denominated $V_{XO}$. As can be seen from Table I, switches E and F remain closed for measuring the initial voltage across the capacitor $C_X$; however, discharge grounding switch G is open at this time. In a particular embodiment, the initial voltage was measured over eight minor cycles of the A to D converter, and the total count for these eight cycles was taken as the initial voltage. The initial voltage value thus determined is stored in the internal memory of microprocessor 10.

Following the initial voltage phase, a charge phase is begun during which the capacitor $C_X$ is charged over a plurality of minor cycles until a predetermined proportion of maximum possible charge is achieved for the voltage levels applied, i.e., until an adequate amount of charge for the desired measurement resolution has been delivered. During this time, switches A and D are closed (for a measurement range involving resistor $R_1$). Switches A and D connect the HI and LO inputs of the A to D converter 12 across resistor $R_1$ and the A to D converter 12 makes successive voltage measurements across resistor $R_1$ until the current through the resistor declines sufficiently for indicating unknown capacitor $C_X$ has received a large proportion of possible charge. The deintegrate count for a first minor cycle during the charge phase is suitably stored and the count for each successive minor count is compared therewith until mc[i] < 0.875 mc[1], where mc[i] is the value of the count for the ith minor cycle. Alternatively, minor cycles are continued until i reaches a predetermined number at which a change to a higher capacitance range can be dictated. This number may vary with range.

Figure 5:
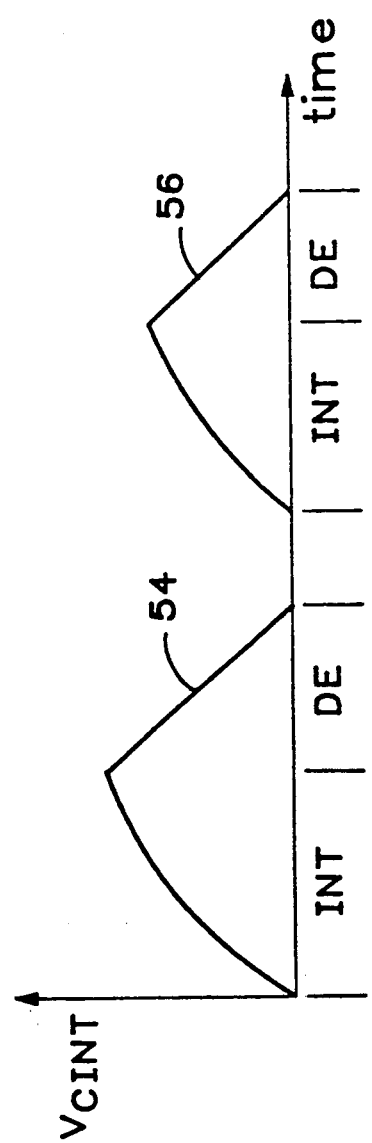

Operation of the A to D converter 12 in the charge phase is illustrated in FIG. 5 where two minor cycles for the A to D converter are depicted. The voltage $V_{CINT}$ is the voltage across capacitor 30 in FIG. 2. The integrate time (INT on the time axis) was 5.5008 milliseconds or 721 counts in a particular embodiment with the deintegrate time (DE on the time axis) being the variable. It will be noted that the first integrate-deintegrate minor cycle 54 is somewhat larger (i.e., extends to a higher voltage) than a next subsequent minor cycle depicted at 56 inasmuch as the current to the capacitor $C_X$ has decreased and the voltage across resistor $R_1$ has correspondingly decreased. The converter cycles about every twenty milliseconds. (This value is a system constant.) As the time DE decreases until it is approximately 0.875 of DE in the initial minor cycle, it is determined that the unknown capacitor has charged to the desired extent.

Switch A' in FIG. 4, as controlled by the microprocessor 10 and state machine 14, is closed only during the INT portions of the charge phase minor cycles depicted in FIG. 5 so that the capacitor $C_X$ only charges at these times, the charge being held on capacitor $C_X$ from the conclusion of one integration period of the converter until the beginning of the next period. Switch A' is thus operated synchronously with the A to D converter. As can be seen in FIG. 6, the voltage across the capacitor increases accordingly along an exponential charging curve during the INT periods and holds its charge during deintegrate (DE) and hold (HD) period until the next INT period begins.

As noted, the A to D converter HI and LO inputs are connected across $R_1$ during the charge phase and the voltage across the resistor $R_1$ (and therefore the current delivered to the unknown capacitor) is ascertained for successive minor cycles as measured by the deintegration times of the A to D converter. The voltage across the resistor $R_1$ (and therefore the current to the capacitor) is "integrated" by adding the total minor cycle counts for the deintegration times during the charge phase. Successive deintegration counts are provided to microprocessor 10, added to the accumulation of previous deintegration counts during the charge phase, and stored in memory. At the conclusion of the charge phase (when the capacitor $C_X$ is substantially charged), the total of the deintegration counts is proportional to the total charge delivered to the capacitor $C_X$ during the charge phase. Thus, during each INT period of the charge phase, current is provided to the capacitor for a given time. The integrated total of voltages across the charging resistor $R_1$ during minor cycles (and therefore the integral of current provided to capacitor $C_X$) is proportional to the net added charge and is indicated by the count total from the A to D converter during the charge phase.

After the capacitor $C_X$ has been charged to the extent indicated, the final voltage, $V_{XF}$, across the capacitor is measured by reconfiguring the switches in FIG. 4 to the final voltage phase as noted in Table I. At this time, switches E and F are closed with the remaining switches being open so as again to measure the voltage across capacitor $C_X$. The voltage was measured in the particular embodiment for eight minor cycles of the A to D converter, represented at the right hand side of FIG. 6, and the total count during this period was taken as $V_{XF}$.

The total count during minor cycles of the charge phase as accumulated via processor 10 is linearly proportional to charge delivered to the capacitor $C_X$ during the charge phase. The capacitance of capacitor $C_X$ is proportional to delta Q/delta V where delta Q is proportional to the measured voltages across resistor $R_1$ during a time period and delta V is final voltage $V_{XF}$ minus initial voltage $V_{XO}$ across $C_X$. In terms of A to D integrator minor cycle counts, $$C_X = \frac{\left(\sum_1^n N_C\right)(T_{INT})(m)}{R_1\left(\sum_1^m N_F - \sum_1^m N_0\right)}$$

where $T_{INT}$ equals a single minor cycle integration time for the measurement of $V_{XO}$ and $V_{XF}$, m equals the number of minor cycles during the $V_{XO}$ and $V_{XF}$ measurement, $N_C$ equals the number of counts from a single charge cycle, n equals the number of minor cycles during the charge phase, and $N_F$ and $N_O$ are respectively the number of counts from a minor cycle for measuring $V_{XF}$ and $V_{XO}$.

The above formula can be reduced to:

$$C_X = \frac{(K_1)\left(\sum_1^n N_C\right)}{\sum_1^m N_F - \sum_1^m N_0}$$

where K1 is defined by circuit constants.

The foregoing explanation with respect to the operation of the FIG. 4 circuit assumes selection of reference charging resistor $R_1$ through which current is delivered to the unknown capacitor $C_X$. However, one of resistors $R_2$ or $R_3$ can be selected instead in accordance with the range of the instrument. In a particular instance, the value of resistor $R_1$ was 1K for a range of capacitances greater than 4 microfarads. Resistor $R_2$ had a value of 10K for a 4 microfarad range, while resistor $R_3$ had a value of 1 megohm for a range of capacitances smaller than conveniently measurable on the 4 microfarad range. For the purpose of effecting these alternative ranges, switches B and B' or C and C' are selected in place of switches A and A' described in the previous discussion. The range may be controlled initially by an operator setting conveyed to the microprocessor which configures the switches of FIG. 4. In an "auto range" situation, the range may be automatically selected or changed by the microprocessor.

Figure 7:
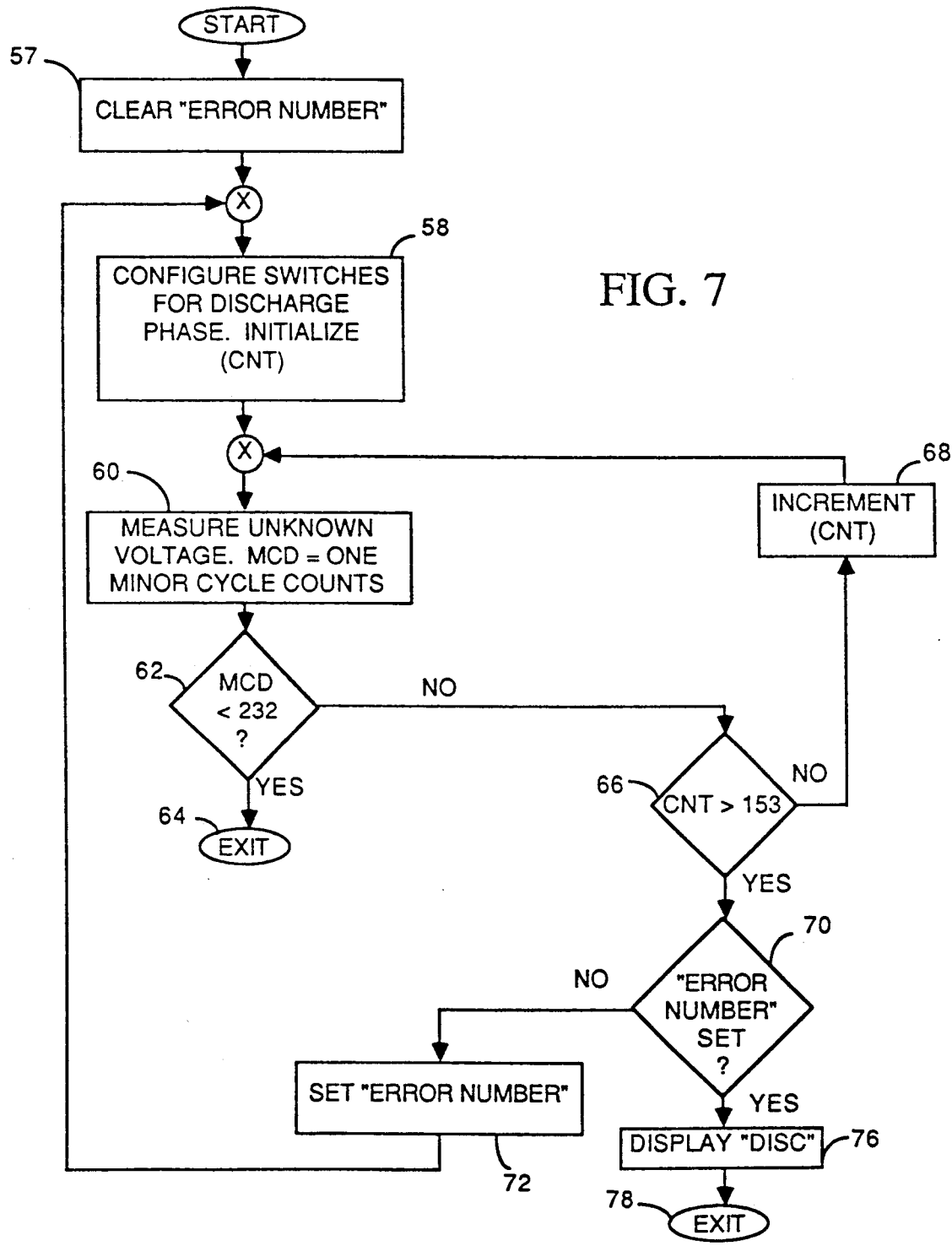

Referring to FIGS. 7 through 11, flow charts are illustrated which outline the program followed by microprocessor 10. Referring to FIG. 7, an "error number" bit is first cleared in block 57. In block 58 the switches 18 are configured for the discharge phase (i.e., switches G, E and F in FIG. 4 are closed) and the unknown voltage across the capacitance is measured (60) in terms of minor cycle count. In decision block 62, it is determined whether the minor cycle count is less than 232 (for this example), corresponding to approximately 400 millivolts, in which case the capacitor is considered substantially discharged, with exit at 64. However, if the minor cycle count is not less than 232, the program proceeds to decision block 66 to determine whether 153 minor cycles (in this example) have as yet taken place, and, if not, the number of minor cycles is incremented at 68 with return to the voltage measurement at 60. If the number of minor cycles reaches 153 without reducing the voltage sufficiently, the determination is made at 70 whether the error number has been set. If not, the error number is set and the procedure beginning at block 58 is started over. If the error number has been set indicating the routine has looped back once via block 72, the instrument displays "discharging" at 76 with exit from this subroutine at 78. The subroutine will in this case ordinarily be repeated. However, setting the "error number" as noted above prevents too frequent flashing of "discharging".

Figure 8:
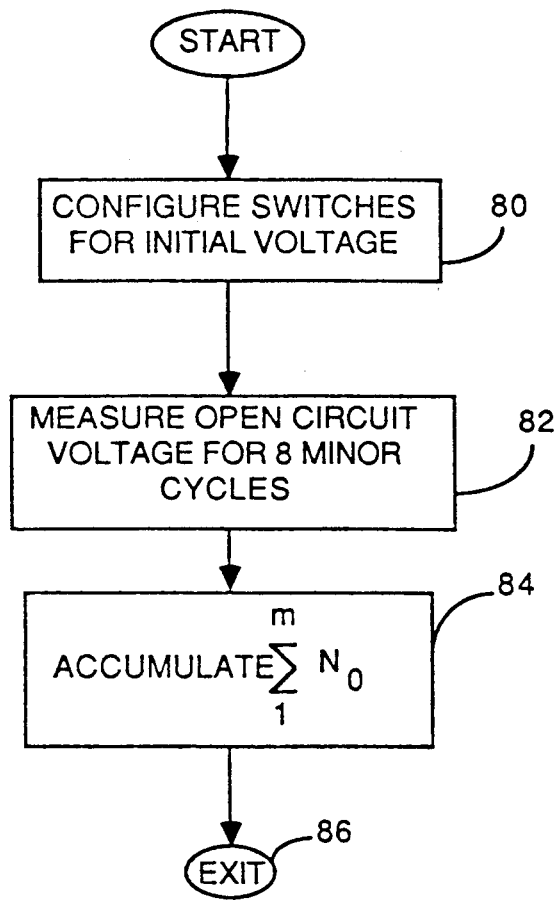

Proceeding to FIG. 8, describing measurement of initial voltage, the switches 18 are configured at block 80 for initial voltage measurement, i.e., switches E and F are closed. (Switch G is open.) The voltage is measured for m = 8 minor cycles at 82 and the count $N_O$ for eight minor cycles is summed in block 84 with exit at 86.

Figure 9:
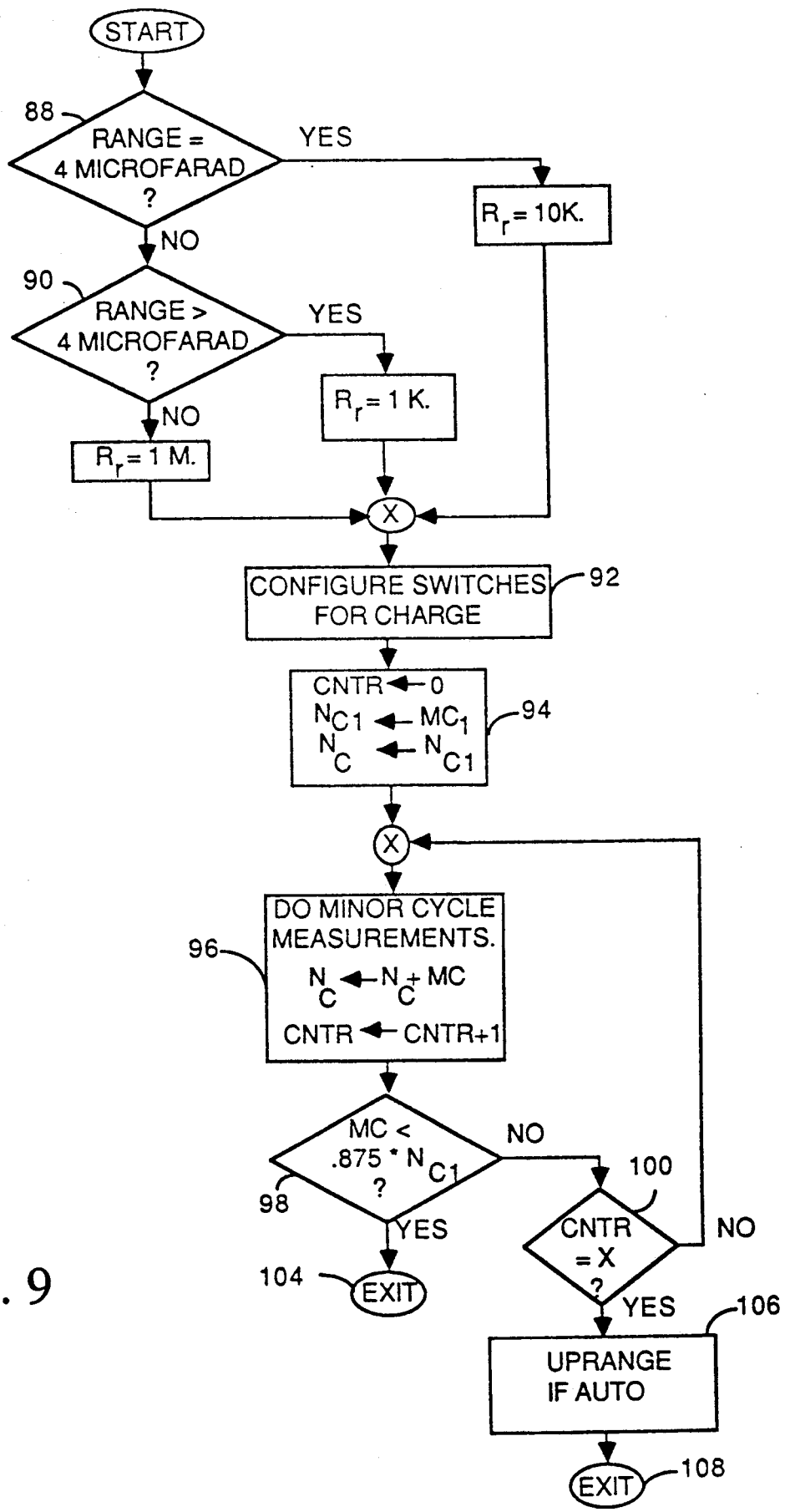

Proceeding to FIG. 9, pertaining to the charge phase, a determination is first made as to the range which has been selected for the instrument. In decision block 88, if the range is the 4 microfarad range, then a reference resistor of 10K is selected corresponding to resistor $R_2$ in FIG. 4 and switches B and B' will be operational rather than switches A and A' or C and C'. If the range is not the 4 microfarad range, then the program proceeds to decision block 90 and it is determined whether the range is greater than 4 microfarads in which case the reference resistor selected will be 1K, i.e., switch $R_1$ of FIG. 4 is to be selected by operation of switches A and A'. If, in block 90, the range is not greater than 4 microfarads, then the reference resistor is selected to be one megohm, corresponding to resistor $R_3$ in FIG. 4, and switches C and C' will be employed. After initial determination, the switches are configured accordingly at 92.

In block 94, the microprocessor 10 variable CNTR is first set to zero and then the value $N_{Cl}$ in memory is set equal to MC[1], the first minor cycle count. The minor cycle measurements continue in block 96 with in each case the value of $$\sum_1^n N_C$$

in memory having the latest minor cycle count added thereto. In decision block 98, it is determined in this embodiment whether the minor cycle count for the current cycle is less than 0.875 multiplied by $N_{Cl}$, the latter being the first minor cycle count, to determine whether the unknown capacitor is substantially charged. If it hasn't, determination is made at 100 as to whether the charging minor cycles have concluded. If not, the program returns to block 96. If the capacitor is substantially charged as indicated by block 98, the program exists at 104 and proceeds to FIG. 10. Alternatively, when X minor cycles have been accomplished, the instrument upranges at 106, exits at 108 and proceeds to FIG. 7.

The value X, above, is desirably dependent upon the capacitance range. In the lower capacitance ranges, e.g. less than about 40 microfarads, X can be 6 or 7, while at higher ranges X should be increased to allow longer charging time. At 100 microfarads X should be about 16, while for substantially higher values, e.g. up to 10,000 microfarads, X is suitably 127. X can be set to 127 for all cases, but a variable X enables faster upranging and therefore faster measurement can be made.

Figure 10:
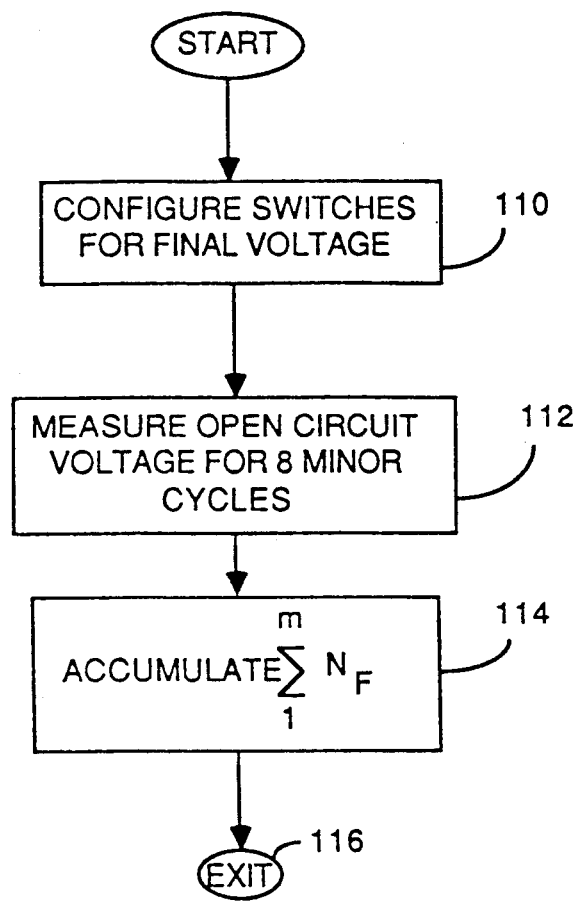

Referring now to FIG. 10, the procedure is depicted for measuring the final voltage. At 110, the switches 18 are configured for a final voltage measurement, that is, switches E and F in FIG. 4 are closed. The open circuit voltage of the capacitor is measured for eight minor cycles at 112 with the total count for the eight minor cycles being stored as $$\sum_1^m N_F$$

at 114 with exit at 116.

Figure 11:
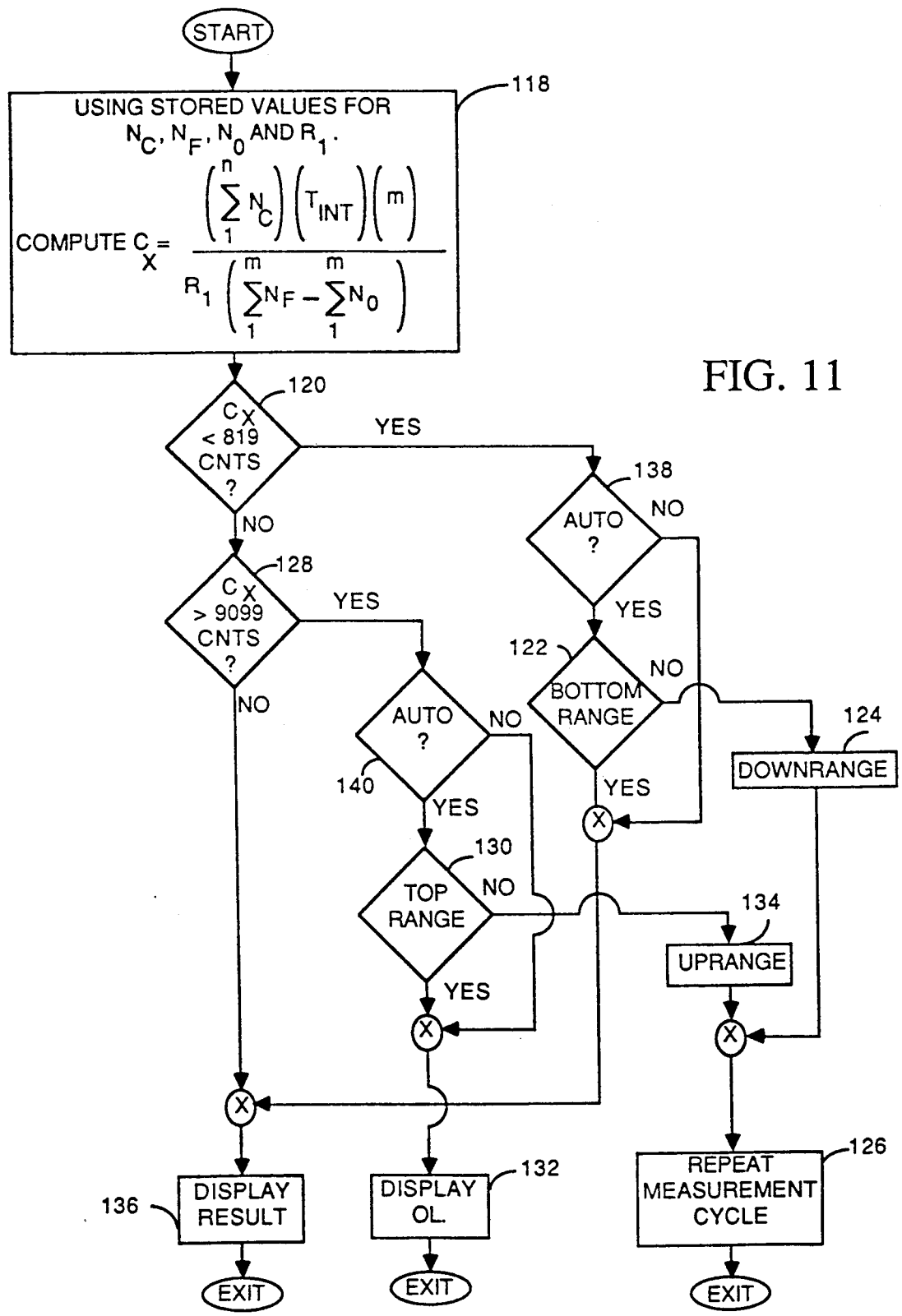

Proceeding to FIG. 11, the value of the capacitor $C_X$ is determined. In block 118, the value $$\frac{\left(\sum_1^n N_C\right)(T_{INT})(m)}{R_r\left(\sum_1^m N_F - \sum_1^m N_0\right)}$$

is computed, wherein $R_r$ equals either $R_1$, $R_2$ or $R_3$. In block 120, if $C_X$ is less than 819 counts in this example, and auto ranging has been selected (138), downranging is indicated. The determination is made in decision block 122 as to whether the instrument is in the bottom range and if not, downrange is accomplished at 124. If the calculated value of the capacitor is greater than 9099 counts at 128 in this example, and if auto ranging has been selected (140), it is determined whether the instrument is in the top range at 130 and if so, or if auto ranging has not been selected, overload is displayed at 132. If not in the top range, the instrument upranges at 134. If the capacitance count does not exceed the aforementioned limits, or if it exceeds the lower limit and the instrument is in the bottom range or auto ranging has not been selected, the results are displayed at 136. Upon exiting FIG. 11, the program returns to FIG. 7. There follows a mathematical derivation of the equation for the value of the unknown capacitance in terms of counts generated by the dual slope A to D converter. The derivation is with reference to the simplified diagram of the unknown capacitor's charging circuit as depicted in FIG. 12 and with reference to FIGS. 2 and 3, the input voltage being chosen as equal to $V_{DE}$.

First, the basic equation for dual slope conversion can be written as $$\frac{N_C}{N_{INT}} = \frac{V_{INT}}{V_{DE}} \qquad (1)$$

where $N_C$ = number of counts accumulated during the de-integrate time $T_{DE}$, $N_{INT}$ = number of counts defined for the fixed integrate time $T_{INT}$, and $V_{INT}$ and $V_{DE}$ are the measured and reference voltages, respectively.

Figure 12:
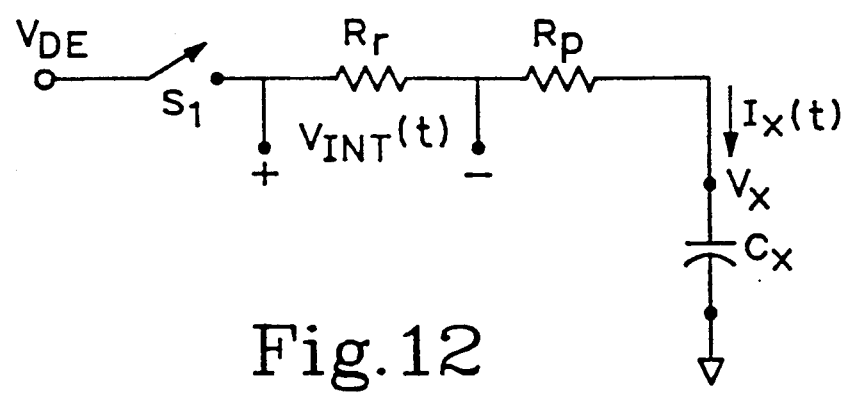

For the circuit of FIG. 12

$$\frac{\sum_{1}^{n} N_C}{N_{INT} \cdot n} = \left(\frac{R_r}{V_{DE}}\right)\left(\frac{1}{T_{INT} \cdot n}\right) \int_{t=0}^{T_{INT} \cdot n} I_X(t) dt \quad (2)$$

where n equals a multiplicity of minor cycles. Then, the charging of $C_X$ during $T_{INT}$ is $$I_X(t) = \left(\frac{V_{DE} - V_{X0}}{R_r + R_p}\right) e^{-(T_{INT} \cdot n)/(R_r + R_p)C_X} \quad (3)$$

Combining (2) and (3), and solving the resultant equation, $$\frac{\sum_{1}^{n} N_C}{N_{INT} \cdot n} = \frac{R_r \cdot C_X(V_{DE} - V_{X0})}{V_{DE} \cdot T_{INT} \cdot n}[1 - e^{-(T_{INT} \cdot n)/(R_r + R_p)C_X}] \quad (4)$$

Now, writing the expression to include initial and final voltages across $C_X$, $$V_{XF} = V_{X0} + (V_{DE} - V_{X0})[1 - e^{-(T_{INT} \cdot n)/(R_r + R_p)C_X}] \quad (5)$$

Combining equations (4) and (5), $$\frac{\sum_{1}^{n} N_C}{N_{INT} \cdot n} = \frac{R_r C_X(V_{XF} - V_{X0})}{V_{DE} \cdot T_{INT} \cdot n} \quad (6)$$

Solving for $C_X$, $$C_X = \frac{\sum_{1}^{n} N_C V_{DE} \cdot T_{INT} \cdot n}{R_r \cdot N_{INT} \cdot n(V_{XF} - V_{X0})} \quad (7)$$

Since $V_{XF}$ and $V_{X0}$ can be written in terms of counts, $$V_{XF} = \frac{\sum_{1}^{n} N_F}{N_{INT} \cdot m}(V_{DE}) \quad (8)$$

$$V_{X0} = \frac{\sum_{1}^{n} N_0}{N_{INT} \cdot m}(V_{DE}) \quad (9)$$

where m is a second multiplicity of minor cycles. Then, substituting into (7) and solving for $C_X$, $$C_X = \frac{\sum_{1}^{n} N_C \cdot T_{INT} \cdot n \cdot N_{INT} \cdot m}{R_r\left(\sum_{1}^{m} N_F - \sum_{1}^{m} N_0\right)(N_{INT} \cdot n)} \quad (10)$$

and the final expression used for a microprocessor solution for $C_X$ is $$C_X = \frac{\sum_{1}^{n} N_C(T_{INT})(m)}{R_r\left(\sum_{1}^{m} N_F - \sum_{1}^{m} N_0\right)} \quad (11)$$

Among the advantages of the circuit according to the present invention are accurate determination of capacitance without assuming zero initial voltage, determination of capacitance without delays as may be associated with fully charging a capacitor, and determination of capacitances over a wide range of values. In the latter respect, a plurality of minor cycles of the dual slope analog-to-digital converter circuit are utilized without being limited to one cycle time of the converter.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method for measuring the value of a capacitor comprising the steps of:
    at least partially discharging said capacitor and measuring the initial voltage across said capacitor,
    cyclically charging said capacitor over a sequence of cycles during each of which a separate charging current is supplied to said capacitor until over the sequence of cycles said capacitor reaches a predetermined proportion of possible charge,
    integrating the currents supplied to said capacitor during said sequence of cycles to provide a value proportional to the actual charge delivered to said capacitor,
    measuring the final voltage on said capacitor, and
    dividing said value proportional to actual charge on said capacitor by the difference between the final and initial voltages across said capacitor to provide a measure of the capacitance of said capacitor.

2. A method for measuring the value of a capacitor comprising the steps of:
    at least partially discharging said capacitor and measuring the initial voltage across said capacitor,
    cyclically charging said capacitor through a reference resistance over a sequence of minor cycles during which charging current is supplied to said capacitor until said capacitor reaches a predetermined proportion of possible charge,
    integrating the voltage drop across said reference resistance during said minor cycles to provide a value proportional to the actual charge delivered to said capacitor, and
    dividing said value proportional to actual charge on said capacitor by a quantity corresponding to the difference between the final and initial voltages across said capacitor to provide a measure of the capacitance of said capacitor.

3. The method according to claim 2 wherein cyclically charging said capacitor is accomplished in synchronism with operation of a dual slope, integrating, analog-to-digital converter coupled across said reference resistance, and wherein integration of the voltage drop across said reference resistance to provide a value proportional to actual charge comprises summing the deintegration periods of said converter.

4. The method according to claim 2 wherein cyclically charging said capacitor is accomplished in synchronism with operation of a dual slope, integrating, analog-to-digital converter connected to measure the voltage across said reference resistance, and wherein integration of the voltage drop across said reference resistance to provide a value proportional to actual charge comprises summing minor cycle counts generated during deintegration periods of said converter multiplied by a constant.

5. The method according to claim 4 wherein said predetermined proportion of possible charge is determined when the number of minor cycle counts during a last minor cycle fall to a predetermined proportion of the number of minor cycle counts during a previous cycle.

6. The method according to claim 5 wherein said previous cycle comprises a first cycle.

7. The method according to claim 4 wherein the initial partial discharging of said capacitor is carried out employing a dual slope, integrating, analog-to-digital converter connected across said capacitor until the minor cycle count generated during a deintegration period of said converter drops below a predetermined value.

8. The method according to claim 7 including continuing minor cycles until a predetermined number of minor cycles is reached whereupon a higher capacitance range is automatically selected, said predetermined number being variable with range and higher for higher capacitance ranges.

9. A method for measuring the value of an unknown capacitor comprising the steps of:
charging said unknown capacitor incrementally during separate periods while during each of said periods providing current to a storage capacitor,
between said periods discharging said storage capacitor at a controlled rate, and
summing the times required for discharging said storage capacitor.

10. A method for measuring the value of an unknown capacitor comprising the steps of:
charging said unknown capacitor incrementally during separate periods while during each of said periods providing current to a storage capacitor, wherein said current is provided to said storage capacitor in response to voltage drop across a charging resistor in series with said unknown capacitor,
between said periods discharging said storage capacitor at a controlled rate, and
summing the times required for discharging said storage capacitor.

11. A method for measuring the value of an unknown capacitor comprising the steps of:
measuring the initial voltage value across said unknown capacitor,
charging said unknown capacitor incrementally during separate periods while during each of said periods providing current to a storage capacitor,
between said periods discharging said storage capacitor at a controlled rate,
summing the times required for discharging said storage capacitor,
measuring the final voltage value across said unknown capacitor,
determining the difference between said final and initial voltage values, and
dividing a function of the sum of times for discharging said storage capacitor by said difference.

12. A method for measuring the value of an unknown capacitor comprising the steps of:
measuring the initial voltage value across said unknown capacitor,
charging said unknown capacitor while simultaneously providing current to a storage capacitor,
discharging said storage capacitor at a controlled rate,
measuring the time required to discharge said storage capacitor,
measuring the final voltage value across said unknown capacitor,
determining the difference between said final and initial voltage values, and
dividing a function of said discharge time by said difference.

13. Apparatus for measuring the value of an unknown capacitor, comprising:
a charging circuit,
means for cyclically connecting said charging circuit to said unknown capacitor during separate time periods,
a storage capacitor,
means for providing current to said storage capacitor during said separate time periods and discharging said storage capacitor, and
means for summing the times required for discharging said storage capacitor.

14. Apparatus for measuring the value of an unknown capacitor, comprising:
a charging circuit, wherein said charging circuit comprises a reference resistor in series with said unknown capacitor,
means for cyclically connecting said charging circuit to said unknown capacitor during separate time periods,
a storage capacitor,
means for providing current to said storage capacitor during said separate time periods and discharging said storage capacitor, said means for providing current to said storage capacitor supplying such current in proportion to the voltage drop across said reference resistor, and
means for summing the times required for discharging said storage capacitor.

15. The apparatus according to claim 13 further including means for ascertaining initial and final voltage values across said unknown capacitor and dividing a function of the sum of times required for discharging said storage capacitor by the difference between said initial and final voltage values.

16. Apparatus for measuring the value of an unknown capacitor, comprising:
a charging circuit,
means for cyclically connecting said charging circuit to said unknown capacitor during separate time periods,
a storage capacitor,
means for providing current to said storage capacitor during said separate time periods and discharging said storage capacitor, and
means for summing the times required for discharging said storage capacitor,
wherein said storage capacitor, means for providing current to said storage capacitor and means for discharging said storage capacitor comprise a dual slope, integrating, analog-to-digital converter.

17. Apparatus for measuring the value of an unknown capacitor, comprising:
a charging circuit comprising a first reference resistor and a second reference resistor,
a dual slope, integrating, analog-to-digital converter coupled to said first and said second reference resistors and adapted to measure the voltage thereacross during successive minor cycles each including an integrate phase and a deintegrate phase, said converter including a counter responsive to deintegrate phase duration, means for alternatively connecting said first and said second reference resistors of said charging circuit to said unknown capacitor during charging phases corresponding to integrate phases of said analog-to-digital converter, and means for summing the counter outputs during successive deintegrate phases of said converter.

18. The apparatus in accordance with claim 17 further including means for connecting said converter for measuring an initial voltage across said unknown capacitor and a final voltage across said unknown capacitor, said means for summing also being effective for dividing a function of said sum by a quantity corresponding to the difference between final and initial voltage across said capacitor multiplied by a circuit constant.

19. The apparatus in accordance with claim 18 further including means for substantially discharging said unknown capacitance before measuring said initial voltage.

20. The apparatus in accordance with claim 18 wherein said means for summing is responsive to counts during successive deintegrate phases for discontinuing said charging phases when the counter output for a particular deintegrate phase drops to a predetermined proportion of a first deintegrate phase.

21. A method for measuring the value of a capacitor comprising the steps of:

selecting a first reference resistance, at least partially discharging said capacitor and measuring the initial voltage across said capacitor, cyclically charging said capacitor through the reference resistance over a sequence of minor cycles during which charging current is supplied to said capacitor, determining whether said capacitor has reached a proportion of possible charge and if said capacitor has not reached said proportion of possible charge, determining whether a predetermined number of minor cycles has occurred and if a predetermined number of minor cycles has not occurred, continuing said cyclical charging steps and said determining step until said capacitor has reached said proportion of possible charge within the predetermined number of minor cycles, but if said predetermined number of minor cycles has occurred and the capacitor has not reached said proportion of possible charge, selecting a second reference resistance and repeating said discharging and measuring step and said cyclical charging steps until said capacitor reaches a proportion of possible charge through the second reference resistance, integrating the voltage drop across the last selected reference resistance during said minor cycles to provide a value proportional to the actual charge delivered to said capacitor, and dividing said value proportional to actual charge on said capacitor by a quantity corresponding to the difference between final and initial voltages across said capacitor to provide a measure of the capacitance of said capacitor.

22. The method according to claim 21 wherein cyclically charging said capacitor is accomplished in synchronism with operation of a dual slope, integrating, analog-to-digital converter coupled across said selected reference resistance, and wherein integration of the voltage drop across the selected reference resistance to provide a value proportional to actual charge comprises summing the deintegration periods of said converter.

23. The method according to claim 21 wherein cyclically charging said capacitor is accomplished in synchronism with operation of a dual slope, integrating, analog-to-digital converter connected to measure the voltage across the selected reference resistance, and wherein integration of the voltage drop across the selected reference resistance to provide a value proportional to actual charge comprises summing minor cycle counts generated during deintegration periods of said converter multiplied by a constant.

* * * * *